(12) United States Patent
Fung et al.

(10) Patent No.: US 9,124,271 B1
(45) Date of Patent: Sep. 1, 2015

(54) METHOD AND APPARATUS FOR COMPOSING AND DECOMPOSING LOW-SKEW NETWORK USING ROUTING INPUT

(71) Applicant: Altera Corporation, San Jose, CA (US)

(72) Inventors: Ryan Fung, Mississauga (CA); David Galloway, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/765,930

(22) Filed: Feb. 13, 2013

Related U.S. Application Data

(62) Division of application No. 13/267,334, filed on Oct. 6, 2011, now Pat. No. 8,402,416, which is a division of application No. 10/998,101, filed on Nov. 24, 2004, now Pat. No. 8,046,729.

(51) Int. Cl.
*G06F 17/50* (2006.01)
*H03K 19/173* (2006.01)

(52) U.S. Cl.
CPC .............. *H03K 19/173* (2013.01); *G06F 17/50* (2013.01)

(58) Field of Classification Search
CPC .................................. G06F 17/50; G06F 9/455
USPC .................................................. 716/132, 134
See application file for complete search history.

(56) References Cited

U.S. PATENT DOCUMENTS

| | | | |
|---|---|---|---|
| 5,329,188 A | 7/1994 | Sikkink et al. | |
| 6,006,025 A | 12/1999 | Cook et al. | |
| 6,204,689 B1 | 3/2001 | Percey et al. | |
| 6,377,912 B1 | 4/2002 | Sample et al. | |
| 6,434,731 B1 | 8/2002 | Brennan et al. | |
| 6,763,513 B1 * | 7/2004 | Chang et al. | 716/114 |
| 6,943,610 B2 * | 9/2005 | Saint-Laurent | 327/295 |
| 7,107,477 B1 | 9/2006 | Singh et al. | |
| 7,116,131 B1 | 10/2006 | Chirania et al. | |
| 8,046,729 B1 | 10/2011 | Fung et al. | |
| 8,161,868 B2 * | 4/2012 | Bolzicco et al. | 99/295 |
| 8,402,416 B1 | 3/2013 | Fung et al. | |
| 2002/0011868 A1 | 1/2002 | Cline | |
| 2007/0164785 A1 | 7/2007 | He | |

* cited by examiner

*Primary Examiner* — Thuan Do
(74) *Attorney, Agent, or Firm* — L. Cho

(57) ABSTRACT

A logic device includes a low-skew network that feeds a subset of elements on the logic device. The low-skew network includes a selector that can select from a plurality of signal sources which includes a first signal source and a second signal source, wherein the second signal source can reach at least one element outside of the subset.

12 Claims, 8 Drawing Sheets

METHOD AND APPARATUS FOR COMPOSING AND DECOMPOSING LOW-SKEW NETWORK USING ROUTING INPUT

RELATED APPLICATION

This application is a divisional of and claims priority and benefit to U.S. application Ser. No. 13/267,334 filed on Oct. 6, 2011 entitled, "Method and Apparatus for Composing and Decomposing Low-Skew Networks", which is a divisional of and claims priority and benefit to U.S. Pat. No. 8,046,729 filed on Nov. 24, 2004 entitled "Method and Apparatus for Composing and Decomposing Low-Skew Networks".

FIELD

Embodiments of the present invention relate to logic designs and logic devices. More specifically, embodiments of the present invention relate to a method and apparatus for composing and decomposing low-skew networks.

BACKGROUND

It is desirable for some types of signals to be implemented with low-skew resources. For example, a designer may wish to implement a clock such that a signal propagating from a source reaches all destinations at approximately the same time. A designer may also wish, for example, to implement an asynchronous clear such that all registers affected by the clear signal are cleared and released at the same time. Modern FPGAs have a variety of low-skew networks available to attempt to address these design needs. These include, for example, chip-level, quadrant-level, and octant-level low-skew networks. Chip-level (or chip-wide) low-skew networks distribute signals with low-skew throughout the entire FPGA. Quadrant-level/octant-level (or local) low-skew networks distribute signals with low-skew throughout smaller areas within an FPGA. Modern FPGA designs, however, place differing demands on low-skew networks available in FPGAs. Some designs heavily utilize chip-level low-skew networks because many high fanout signals (that tend to more naturally cover a large portion of the chip) need to be distributed with low-skew. Other designs heavily utilize octant-level low-skew networks because many low fanout signals (that tend to be highly localized) need to be distributed with low skew. It is more efficient to use these octant-level networks for the low fanout signals, leaving the chip-wide networks for any high fanout signals the designs may have.

Local low-skew networks utilize less silicon area than chip-wide networks. Hence, more low-skew networks can be built cost effectively by creating local networks as opposed to chip-wide networks. This allows a larger number of signals to be distributed with low skew. Local low-skew networks also have the added benefits of imposing a smaller delay on signals and consuming less power than chip-wide networks. However, because local low-skew networks can only distribute signals to a portion of the FPGA chip, placement of elements utilizing these networks needs to be constrained to the smaller area.

Due to silicon area and metal layer costs, the implementation of a large number of chip-wide and local networks is prohibitive. Thus, FPGA manufacturers have had to decide on the number of dedicated chip-wide networks and local networks to offer in an FPGA. However, tailoring the network counts to any particular design may be disadvantageous for other designs.

Thus, what is needed is a low-skew network design that offers the flexibility to satisfy both the needs of designs that heavily utilize chip-wide low-skew networks and the needs of designs that require a larger number of local low-skew networks.

SUMMARY

According to an embodiment of the present invention, a low-skew network is disclosed that may be configured to distribute a signal to an area, such as that spanned by a chip-wide network for example, or to distribute multiple signals to a plurality of sub-areas that are sub-regions of the larger area, such as those spanned by a plurality of quadrant local networks. This composable/decomposable low-skew network allows a programmable logic device (PLD) to better support a variety of different designs. The designs may include, for example, a larger number of low-skew networks that span the device, or a larger number of local low-skew networks.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

Figure 1:
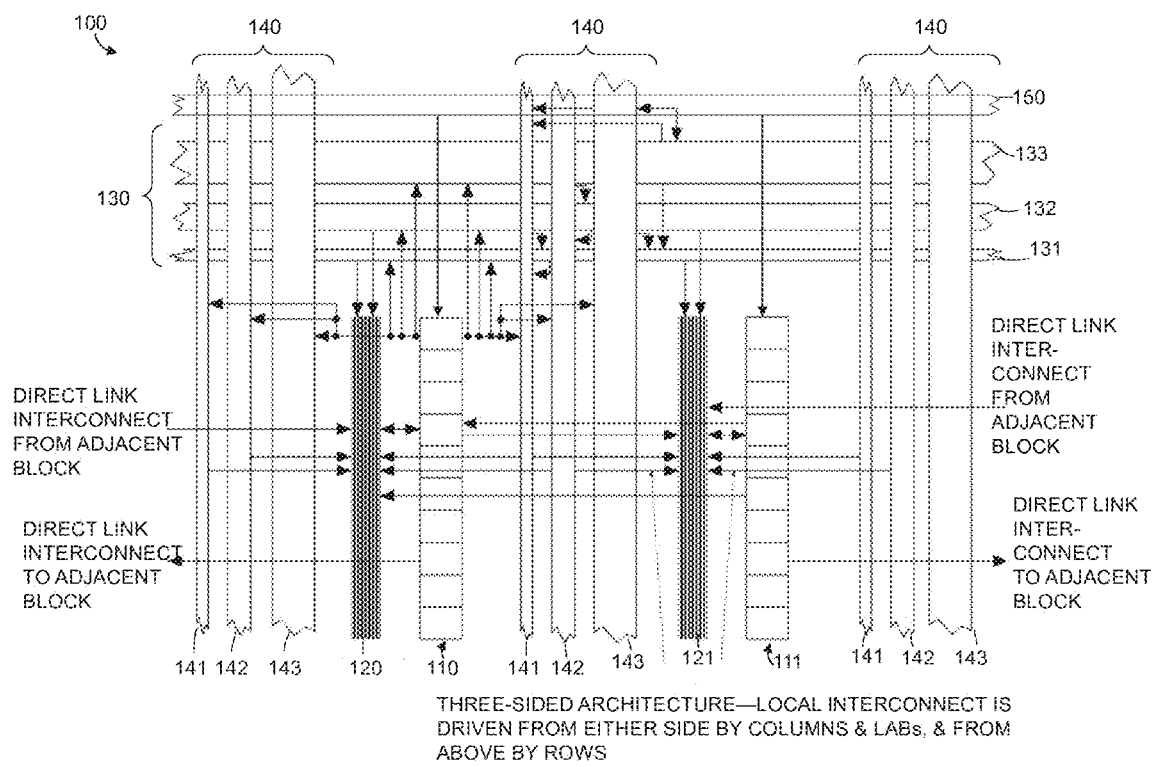
FIG. 1 illustrates an FPGA according to an embodiment of the present invention.

FIG. 1 illustrates a portion of an exemplary target device 100 (FPGA) according to an embodiment of the present invention. The present invention may be implemented on the target device 100. According to one embodiment, the target device 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop.

The target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110 and a second column of LABs is shown as 111.

The target device 100 includes memory blocks (not shown). The memory blocks may be, for example, dual port random access memory (RAM) blocks that provide dedicated true dual-port, simple dual-port, or single port functionality for various bit widths and depths. The memory blocks may be grouped into columns across the target device in between selected LABs or located individually or in pairs within the target device 100.

The target device 100 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 100.

The target device 100 includes a plurality of input/output elements (IOEs) (not shown). Each IOE connects to an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals.

The target device 100 includes LAB local interconnect lines 120-121 that transfer signals between LEs in the same LAB. Some LAB local interconnect lines are driven by column and row interconnects and LE outputs within the same LAB. Neighboring LABs, memory blocks, IOEs, or DSP blocks may also drive the LAB local interconnect lines 120-121 through direct link connections.

The target device 100 includes a plurality of row non-local interconnect lines ("H-type wires") 130 that span fixed distances. Row interconnect lines 130, that include H4 131, H8 132, and H24 133 interconnects, may be used to route signals to and from LABs, DSP blocks, IOEs, and memory blocks within the same row. The H4 131, H8 132, and H24 133 interconnects span a distance of up to four, eight, and twenty-four logical units respectively. The row interconnects 130 may drive and be driven by LABs, DSP blocks, RAM blocks, and horizontal IOEs.

The target device 100 includes a plurality of column non-local interconnect lines ("V-type wires") 140 that operate similarly to the row interconnect lines 130. The column interconnect lines 140 may be used to vertically route signals to and from LABs, memory blocks, DSP blocks, and IOEs. These column interconnect lines 140 include V4 141, V8 142, and V16 143 interconnects that traverse a distance of four, eight, and sixteen logical units respectively, in a vertical direction. In general, the distinction between local and non-local interconnect is that local interconnect lines only span one logical location, while non-local interconnect lines span more than one logical location.

The target device 100 includes a low-skew network 150. The low-skew network 150 may be a dedicated network that spans the entire area of the chip ("chip-wide network"), a dedicated network that spans a portion of the entire area of the chip ("local network"), or a composable/decomposable low-skew network. The low-skew network 150 may be used to distribute control signals such as clocks, asynchronous clears, and other signals. It should be appreciated that FIG. 1 illustrates only a portion of a single low-skew network, and that a target device 100 may include a plurality of low-skew networks. According to an embodiment of the present invention, the target device 100 may include dedicated chip-wide networks, dedicated local networks, and composable/decomposable low-skew networks.

FIG. 1 illustrates an exemplary embodiment of a target device. It should be appreciated that a system may include a plurality of target devices, such as that illustrated in FIG. 1, cascaded together. It should also be appreciated that the target device may include elements arranged in a manner different than in the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II line of chips.

Figure 2:
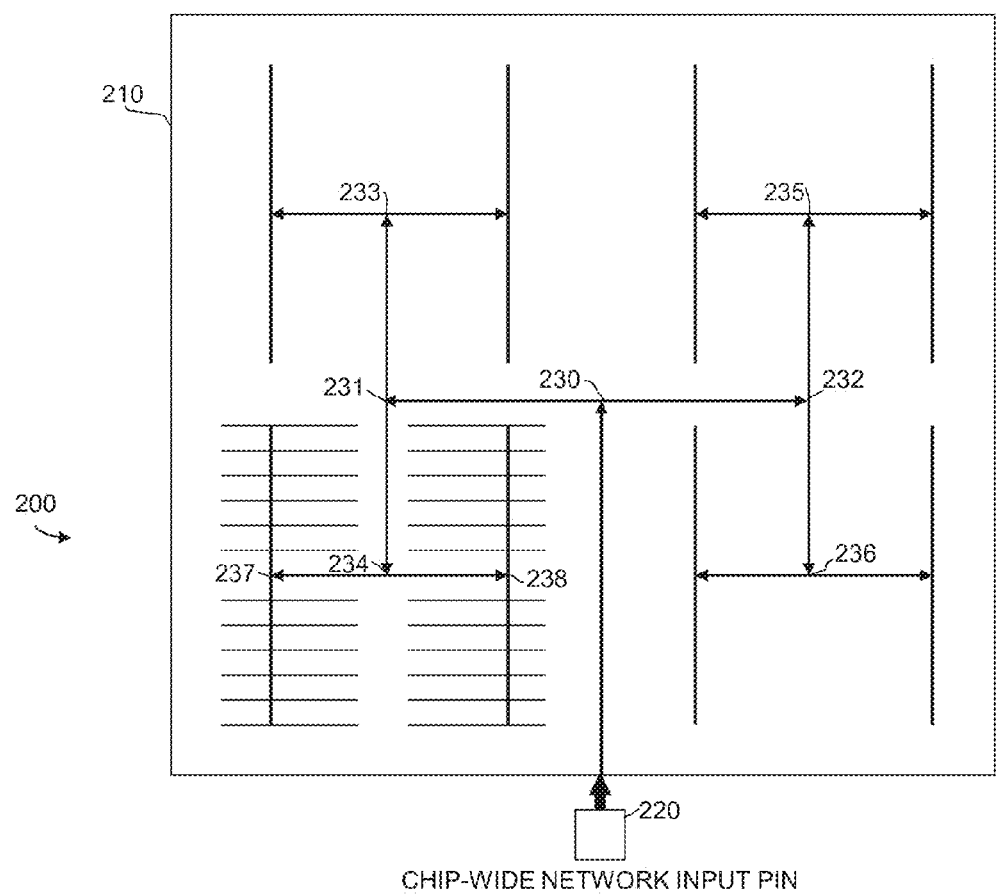
FIG. 2 illustrates a dedicated chip-wide low-skew network according to an embodiment of the present invention.

FIG. 2 illustrates a dedicated chip-wide low-skew network 200 according to an embodiment of the present invention. The dedicated chip-wide low-skew network 200 may be used to implement one of the low-skew networks on target device 100 (shown in FIG. 1). The chip-wide low-skew network 200 is shown without other circuits or components of an FPGA chip 210. The chip-wide low-skew network 200 is built as an "H-tree". An H-tree structure attempts to equalize the delays (minimize skew), by equalizing path lengths, from a source to all destinations. The H-tree structure includes one or more sub-structures that resemble the letter 'H'; the structure carries signals first to the center of areas before distributing signals to constituent sub-areas. For example, a signal from a source such as chip-wide network input pin 220 may first be routed to a center point 230 of the FPGA chip 210. From the center point 230 of the FPGA chip 210, the signal is routed to center points 231 and 232 of the chip halves of FPGA chip 210. From the center points 231 and 232 of the chip halves, the signal is routed to center points 233-234 and 235-236, respectively, of quadrants of the FPGA chip 210. From the center point 234 of a quadrant of the FPGA chip 210, the signal is routed to center points 237 and 238 of eighth sections of the FPGA chip 210. Once a certain level is reached in this hierarchical structure, a non-H-tree topology might be used to distribute the signal within small regions because the skew of most topologies in that small region is negligible, in terms of absolute delay. The number of H-tree levels to use is determined, in part, from skew requirements. In the embodiment shown in FIG. 2, the signal from center points 237 and 238 of eighth sections of the FPGA chip 210 are routed to horizontal lines that span the eighth sections of the FPGA chip 210 where they can be connected to destinations such as LABs (not shown) on the FPGA chip 210.

The H-tree configuration of the chip-wide low-skew network 200 "equalizes" delays from a source, such as chip-wide network input pin 220, to destination "leaves" (for example, LABs) located throughout the FPGA, no matter the locations of the leaves. For simplicity, FIG. 2 illustrates the lowest-level of the H-tree for the lower left quadrant only.

Figure 3:
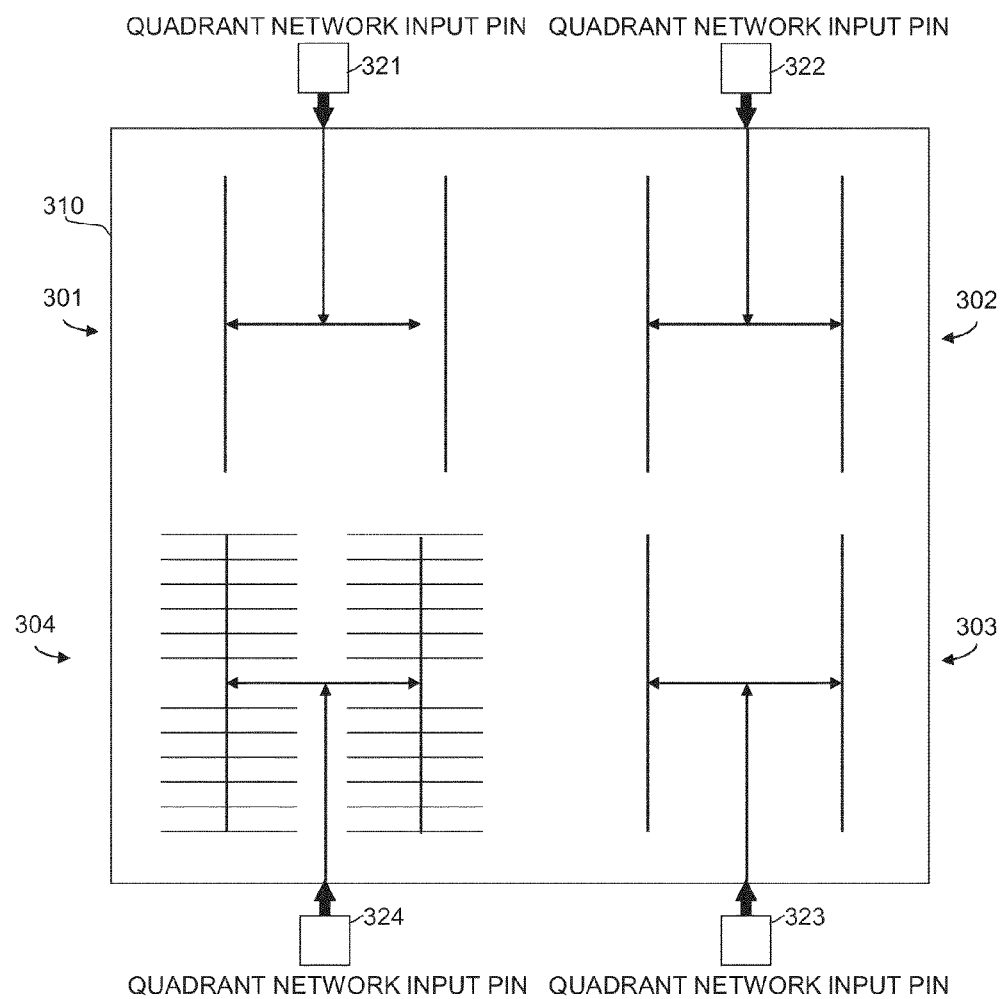
FIG. 3 illustrates a dedicated quadrant low-skew network according to an embodiment of the present invention.

FIG. 3 illustrates four dedicated quadrant-wide low-skew networks 301-304 according to an embodiment of the present invention. One or more of the dedicated quadrant-wide low-skew networks 301-304 may be used to implement one or more of the low-skew networks in target device 100 (shown in FIG. 1). Each of the quadrant-wide low skew networks 301-304 has a corresponding quadrant network input pin 321-324, respectively. Each of the quadrant network input pins 321-324 may be fed by an independent signal; these independent signals will, in turn, be distributed to different quadrants of the FPGA chip 310.

The H-tree configuration of a quadrant-wide low-skew networks "equalizes" delays from a source, such as quadrant-wide network input pin 321, to destination "leaves" (such as LABs) in the respective quadrant of the FPGA, regardless of the precise location of the leaves in the quadrant.

Figure 4:
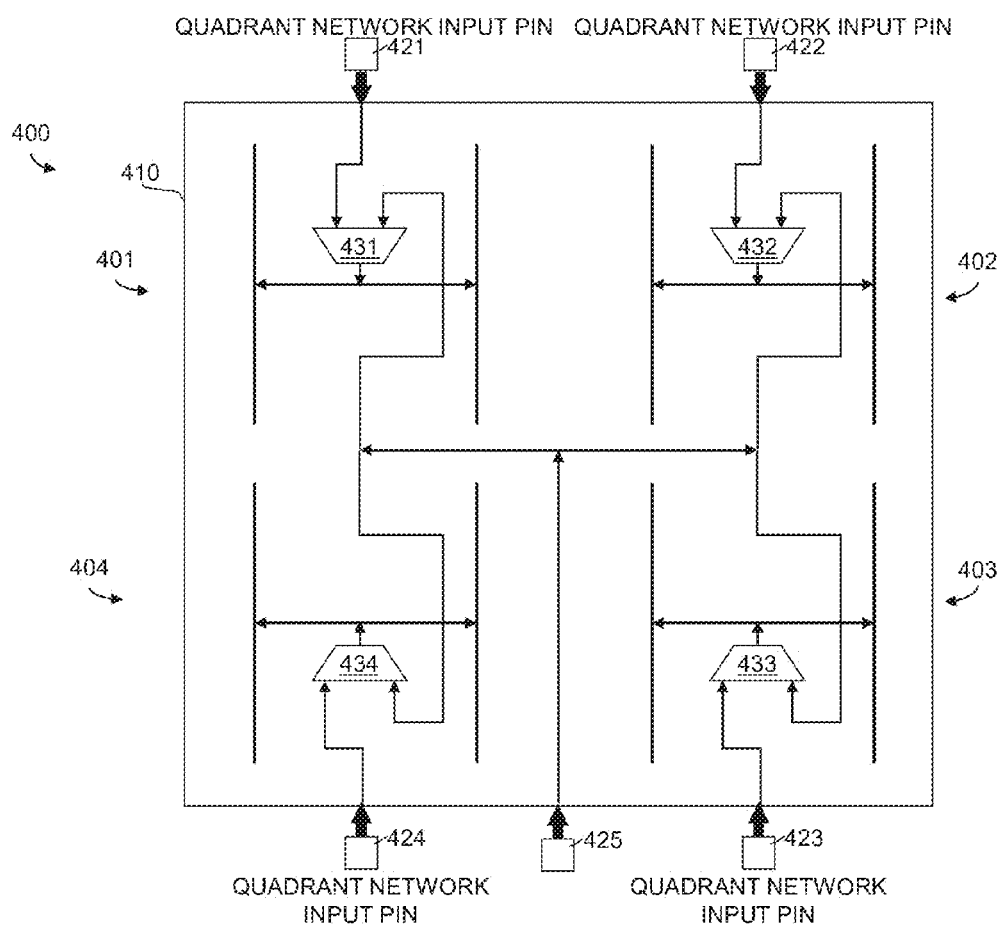
FIG. 4 illustrates a composable/decomposable low-skew network according to an embodiment of the present invention.

FIG. 4 illustrates a composable/decomposable low-skew network 400 according to an embodiment of the present invention. The composable/decomposable low-skew network 400 includes a plurality of quadrant-wide low-skew networks 401-404. Each of the quadrant-wide low-skew networks 401-404 includes a selector 431-434, respectively. The selectors 431-434 may be implemented by multiplexers, tri-state buffers, or any known programmable switch. Each selector 431-434 receives a first input from a corresponding quadrant network input pin 421-424, respectively and a second input from a chip-wide network input pin 425 via a topology that is structured as an H-tree.

All selectors may select their first inputs from their corresponding quadrant network input pins to configure ("decompose") the composable/decomposable low-skew network 400 to operate as four distinct quadrant-wide low-skew networks. Alternatively, all the selectors 431-434 may select their second inputs from the chip-wide network input pin 425 to configure ("compose") the composable/decomposable low-skew network 400 to operate as a single chip-wide low-skew network. Alternatively, each selector may choose to select its first or second input independent of other selectors to configure ("partially compose/decompose") the composable/decomposable low-skew network 400 to operate as a hybrid low-skew network. For example, selectors 431 and 432 may select signals corresponding with quadrant network input pins 421 and 422, respectively, to create two distinct quadrant-wide low-skew networks 401 and 402. At the same time, selectors 433 and 434 may select signals from the chip-wide network input pin 425 to create a half-chip low-skew network from two quadrant-wide low-skew networks 403 and 404.

The selectors 431-434 of the composable/decomposable low-skew network 400 can be viewed as allowing a plurality of "quadrant-wide low-skew networks" to be combined (composed or stitched) together so that a signal can be distributed across a larger region with low-skew. Alternatively, the selectors 431-434 can be viewed as allowing a single chip-wide low-skew network to be broken-up (decomposed or unstitched) so that portions of the chip-wide low-skew network can be used to distribute a plurality of signals throughout smaller areas on the chip.

Although the composable/decomposable low-skew network 400 is described with reference to an area that spans the entire chip and sub-areas that span quadrants of the chip, it should be appreciated that embodiments of the invention may pertain to areas and sub-areas that span other extents of the chip. In an embodiment, the sub-areas correspond to lower levels of the H-tree structure that spans the main area. For example, in an embodiment of the present invention, the composable/decomposable low-skew network 400 may cover an area that spans the entire chip, when fully composed. When decomposed, the network may unstitch to cover two separate sub-areas that each span half of the chip. Alternatively, the composable/decomposable low-skew network 400 may cover an area that spans three quadrants of the chip, when fully composed. When decomposed, the network may unstitch to cover twelve sub-areas that each span $1/16^{th}$ of the chip. In other embodiments, selectors may be employed at several levels of the same H-tree. For example, a composable/decomposable low-skew network can be configured to form independent "quadrant low-skew networks" from independent "octant low-skew networks", or a "chip-wide low-skew network", in turn, from the independent "quadrant low-skew networks".

The low-skew network has also been shown as constructed with H-trees. It should be appreciated that other methods and techniques for routing signals from a source to destinations with low-skew may be utilized with embodiments of the present invention.

Figure 5:
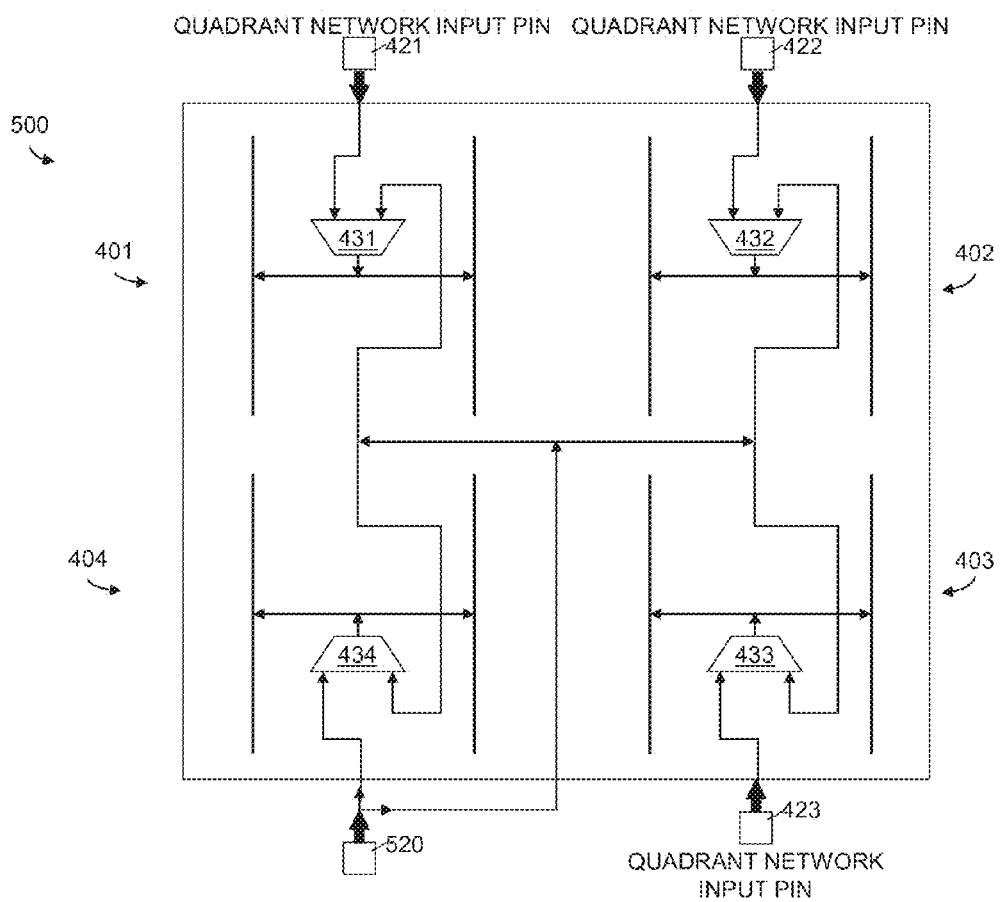
FIG. 5 illustrates a composable/decomposable low-skew network according to an alternate embodiment of the present invention.

FIG. 5 illustrates a composable/decomposable low-skew network 500 according to an alternate embodiment of the present invention. In this embodiment, the chip-wide network input pin 425 and the quadrant network input pin 424 previously shown in FIG. 4 are implemented with a single input pin 520. This is allowable because all five of the input pins 421-425 (shown in FIG. 4) are never used at the same time. Thus, a pin may be conserved. In some embodiments, it might be advantageous to "shield" input pin 520, in FIG. 5, so when it is driving the lower-left quadrant selector, the capacitance of the chip-wide H-tree is not seen. This may be accomplished by utilizing appropriate buffers. In another embodiment, a pin can be saved by removing, from FIG. 4, the lower-left quadrant selector and the corresponding quadrant network input pin completely leaving the chip-wide H-tree always driving the lower-left quadrant.

Figure 6:
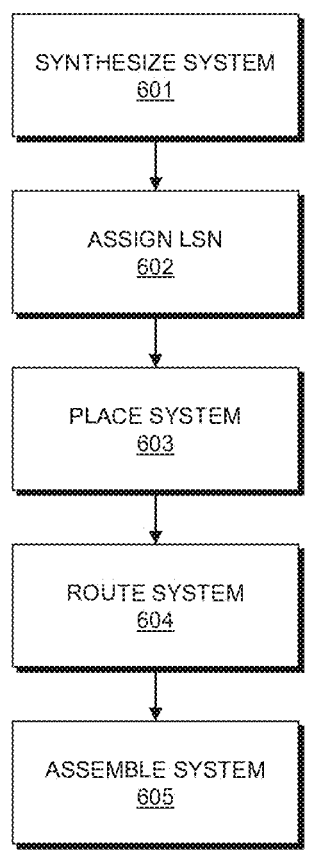
FIG. 6 is a flow chart illustrating a method for designing a system on an FPGA according to an embodiment of the present invention.

FIG. 6 is a flow chart illustrating a method for designing a system for an FPGA according to an embodiment of the present invention. At 601, the system is synthesized. Synthesis includes generating or receiving a logic design of the system to be implemented by a target device. According to an embodiment of the present invention, synthesis generates an optimized logical representation of the system from an HDL or other design definition. Synthesis also includes technology mapping the optimized logic design to implement logic components such as logic gates using the types of resources available in the target device. According to an embodiment of the present invention, a netlist is generated from mapping. This netlist may be an optimized technology-mapped netlist generated from the HDL or other design definition.

At 602, low-skew networks are assigned for signals requiring low-skew distribution. According to an embodiment of the present invention, signals to be distributed on low-skew networks are first assigned to the dedicated low-skew networks that are available. After all dedicated low-skew networks have been assigned, composable/decomposable low-skew networks are configured to meet the requirements of the remaining signals and are assigned. According to one embodiment, clock signals are assigned low-skew networks in order of descending fanout. After all available low-skew networks have been assigned, any remaining signals will be distributed using regular routing resources. This embodiment allows clock signals to be distributed with low-skew. It should be appreciated that other types of signals may also be assigned to low-skew networks.

At 603, the mapped logical system design is placed. Placement works on the optimized technology-mapped netlist to produce a placement for each of the logic components. According to an embodiment of the present invention, placement includes fitting the system on the target device by determining which resources on the target device to use to implement the logic components. Placement decisions may be made to comply with the low-skew network assignment made at 602.

At 604, it is determined which routing resources should be used to connect components such as LUTs and registers. According to an embodiment of the present invention, routing may be performed in response to the low-skew network assignment.

At 605, an assembly procedure is performed. The assembly procedure involves creating a data file that includes information determined by the fitting procedure described by 601-604. The data file may be a bit stream that may be used to program the target device.

Figure 7:
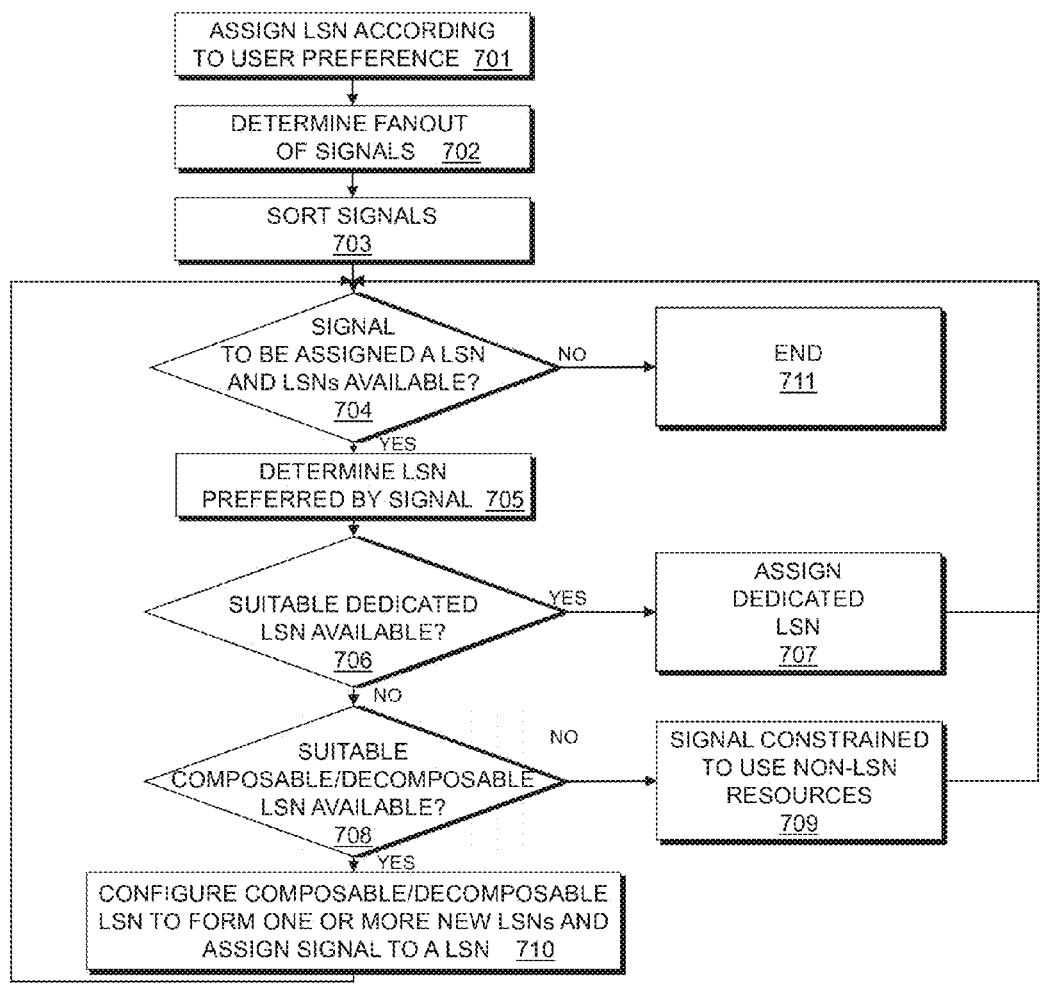
FIG. 7 is a flow chart illustrating a method for assigning composable/decomposable low-skew networks according to an embodiment of the present invention.

FIG. 7 is a flow chart illustrating a method for assigning low-skew networks according to an embodiment of the present invention. The method shown here may be used to implement 602 shown in FIG. 6. At 701, user-specified low-skew network (LSN) constraints are processed and the appropriate assignments are made. For example, if a user designates a particular low-skew network for a specified signal, control proceeds to make the assignment if possible.

At 702, the fanout of the signals in the system are determined. This may be achieved, for example, by determining how many functional blocks each signal reaches.

At 703, a subset of the signals is sorted. The sorted signals indicate an order of preference for processing. According to an embodiment of the present invention, the sorted signals include clock signals ordered by decreasing fanout.

At 704, it is determined whether there is a signal from the set of sorted signals that still needs to be assigned to a low-skew network and whether there are LSNs available. If there are no signals left to be assigned to a low-skew network or there are no LSNs available, control proceeds to 711. Otherwise, control proceeds to 705.

At 705, a set of preferred low-skew network extents (low-skew network types) for distributing the signal is determined. According to an embodiment of the present invention, a single preference may be determined. However, it should be appreciated that in other embodiments, more than one preference may be determined where each preference is ranked relative to the others. For example, it may be preferred that high fanout signals use chip-wide low-skew networks but would settle for quadrant low-skew networks if there are not too many fanouts, medium fanout signals use quadrant low-skew networks but would settle for chip-wide, or octant low-skew networks if there are not too many fanouts, and low fanout signals use octant low-skew networks but would settle for first quadrant low-skew networks, and second chip-wide low-skew networks even though that might be wasteful. The embodiment described in FIG. 7 assumes a single preference is determined.

At 706, it is determined whether a dedicated low-skew network is available that meets the preferences of the signal and that satisfies the requirements of the signal. A requirement of the signal may be, for example, that all the constrained fanouts of the signal will be reachable by the particular low-skew network. According to an embodiment of the present invention, it is determined whether the particular preferred low-skew network type is available. Other embodiments may consider the set of low-skew networks preferred for a signal. If a dedicated low-skew network that meets the requirements and preferences of the signal is available, control proceeds to 707. Otherwise, control proceeds to 708.

At 707, the dedicated low-skew network that is available is assigned to the signal. Control proceeds to 704.

At 708, it is determined whether a composable/decomposable low-skew network is available that can be configured (composed or decomposed) to satisfy the requirements and preferences of the signal. If such a composable/decomposable low-skew network is not available, control proceeds to 709. Otherwise, control proceeds to 710.

At 709, the signal is constrained to use non-LSN resources. According to an embodiment of the present invention, regular routing resources such as V-type wires and H-type wires may be used to distribute the signal.

At 710, the composable/decomposable low-skew network is configured to meet the requirements of the signal. According to an embodiment of the present invention, the composable/decomposable low-skew network may be configured by programming selectors to compose a plurality of sub-area low-skew networks into a larger low-skew network or decompose a low-skew network into smaller sub-area low-skew networks to satisfy the preferences and requirements of the signal. Control proceeds to 704.

It should be appreciated that configuration of a composable/decomposable low-skew network may yield a set of low-skew networks that can be essentially treated as dedicated. For example, a chip-wide composable/decomposable low-skew network may be decomposed to yield four quadrant low-skew networks. One quadrant low-skew network may be assigned to the signal while the others can be treated as available "dedicated" quadrant low-skew networks for other signals to use. Similarly, for example, a chip-wide composable/decomposable low-skew network may be decomposed to yield one "dedicated" quadrant low-skew network and one "composable/decomposable" three-quadrant low-skew network. The quadrant low-skew network may be assigned to the signal while the composable/decomposable network may be available for configuration for use by other signals.

At 711, control terminates the process.

FIGS. 6 and 7 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that the illustrated technique may be substituted with other techniques. For example, rather than using the greedy technique presented, low-skew network assignment may be performed, in part, by using graph-based matching techniques or, in part, by using iterative techniques that attempt to improve the current assignment, for example, to better satisfy signal preferences.

Figure 8:
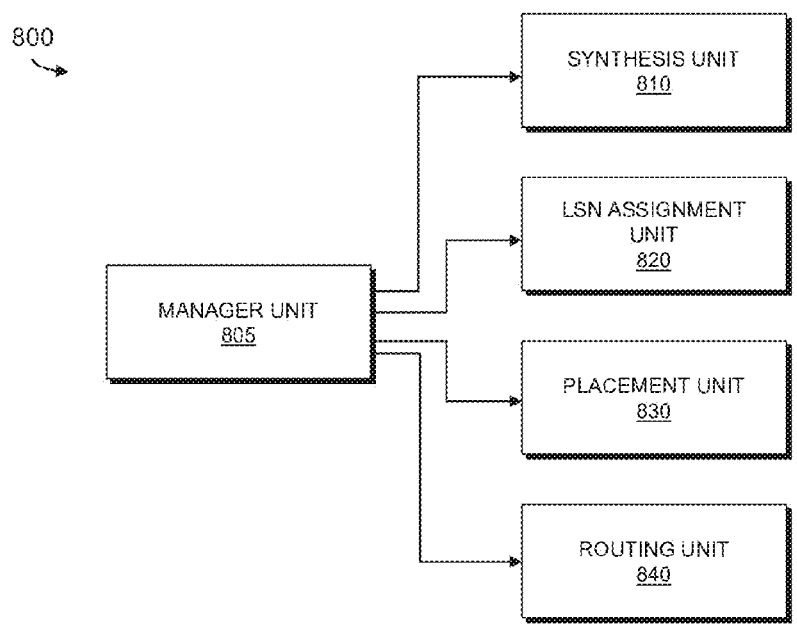
FIG. 8 is a block diagram of a system designer according to an embodiment of the present invention.

FIG. 8 illustrates a system designer 800 according to an embodiment of the present invention. The system designer 800 may be an EDA tool. FIG. 8 illustrates software modules implementing an embodiment of the present invention. According to one embodiment, system design may be performed by a computer system (not shown) executing sequences of instructions represented by the software modules shown in FIG. 8. Execution of the sequences of instructions causes the computer system to support system design as will be described hereafter. In alternate embodiments, hardwire circuitry may be used in place of or in combination with software instructions to implement the present invention. Thus, the present invention is not limited to any specific combination of hardware circuitry and software. The system designer 800 includes a manager module 805. The manager module interfaces with and manages the other components in the system designer 800.

The system designer 800 includes a synthesis unit 810. The synthesis unit 810 generates or receives a logic design of a system to be implemented by the target device such as the target device 100 shown in FIG. 1. According to an embodiment of the system designer 800, the synthesis unit 810 takes a conceptual Hardware Description Language (HDL) or other design definition and generates an optimized logical representation of the system. The optimized logical representation of the system generated by the synthesis unit 810 may include a representation that has a minimized number of components such as functional blocks and registers required for the system. Alternatively, the optimized logical representation of the system generated by the synthesis unit 810 may include a representation that has reduced depths of logic and lower signal propagation delays. The synthesis unit 810 also determines how to implement functional blocks and registers in the optimized logic representation utilizing specific resources on the target device creating an optimized "technology-mapped" netlist. The technology-mapped netlist indicates how the types of resources available in the target device 100 are utilized to implement the system. The technology-mapped netlist may, for example, include components such as LEs on the target device.

The system designer 800 includes a low-skew network (LSN) assignment unit 820. The low-skew network assignment unit 820 assigns low-skew networks to signals requiring low-skew distribution. According to an embodiment of the system designer, signals to be distributed on low-skew networks are first identified based on signal type and fanout size. The low-skew network assignment unit 820 then assigns dedicated low-skew networks that are available to the identified signals. After all dedicated low-skew networks have been assigned, composable/decomposable low-skew networks are configured to meet the requirements of additional signals and signals are assigned, as appropriate, to the resulting networks. The low-skew network assignment unit 820 may configure a composable/decomposable low-skew network by programming selector(s) to compose or stitch together a plurality of sub-area low-skew networks to meet the requirements and preferences of a signal. Alternatively, the low-skew network assignment unit 820 may configure a composable/decomposable low-skew network by programming selector(s) to decompose or break apart a low-skew network into sub-area low-skew networks of smaller size such that at least one of the resulting networks address the requirements and preferences of a signal.

The system designer 800 includes a placement unit 830. The placement unit 830 fits the system on the target device by determining which resources on the target device are to be used for specific functional blocks and registers. According to an embodiment of the system designer 800, the placement unit 830 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed, for example, by assigning the clusters to specific LABs on the target device 100. The placement unit 830 may utilize a cost function in order to determine a good assignment of resources on the target device.

The system designer 800 includes a routing unit 840. The routing unit 840 determines the routing resources on the target device to use to provide interconnection between the functional blocks and registers in the target device.

The techniques above have been described with reference to designing a programmable logic device. It should be appreciated that the techniques (for synthesis, low-skew network assignment, placement, routing, etc.) may be used during the creation/processing/optimization/implementation of any logic design, such as application specific integrated circuits (ASICs), for example.

Embodiments of the present invention (for example, exemplary process described with respect to FIGS. 6 and 7) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMS, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense. Furthermore, the descriptions have referred to EDA tools, FPGAs and PLDs, however, the methods and apparatuses are applicable to other logic design styles/tools, type of devices, and types of designs.

What is claimed is:

1. A method for designing a system on a target device, comprising:
    determining a size of a low-skew network for routing a signal; and
    in response to the size determined, programming a dedicated composable/decomposable low-skew network, having a plurality of sub-area low-skew networks each including a selector that receives a first input from a corresponding sub-area network input pin, and a second input from a routing path coupled to an area network input pin, that equalizes delays from a source to a plurality of locations on the target device to route one of 1) a single signal to the plurality of locations, and 2) a plurality of signals to the plurality of locations, wherein each of the plurality of signals is routed to a different one of the plurality of locations, and wherein at least one of the determining and programming is performed by a processor.

2. The method of claim 1, wherein determining the size of the low-skew network needed for routing the signal comprises determining a number of nodes the signal routes to.

3. The method of claim 1 further comprising programming each of the selectors to output one of 1) the first input such that the plurality of signals are output to the plurality of locations, and 2) the second input such that the single signal from the area network input pin is output to the plurality of locations.

4. The method of claim 1, wherein the dedicated composable/decomposable low-skew network is structured as an H-tree.

5. A method for programming a dedicated composable/decomposable low-skew network connecting a source to a plurality of locations, the method comprising:
    routing one of 1) a single signal to the plurality of locations, and 2) a plurality of signals to the plurality of locations, wherein each signal of the plurality of signals is routed to a different location of the plurality of locations, and wherein the routing performed by a processor, wherein the composable/decomposable low-skew network includes a plurality of sub-area low-skew networks each having a selector that receives a first input from a corresponding sub-area network input pin, and a second input from a routing path coupled to one of the sub-area network input pins.

6. The method of claim 5 further comprising programming each of the selectors to output one of 1) the first input such that the plurality of signals is output to the plurality of locations, and 2) the second input such that the single signal from the one of the sub-area network input pins is output to the plurality of locations.

7. The method of claim 5, wherein the dedicated composable/decomposable low-skew network is structured as an H-tree.

8. The method of claim 5, wherein the programming is performed in response to a size of the low-skew network.

9. The method of claim 8 further comprising determining the size of the low-skew network needed for routing the signal by determining a number of nodes the signal routes to.

10. A non-transitory computer readable medium including a sequence of instructions stored thereon for causing a computer to execute a method, comprising:
   determining a size of a low-skew network for routing a signal; and
   in response to the size determined, programming a dedicated composable/decomposable low-skew network, having a plurality of sub-area low-skew networks each including a selector that receives a first input from a corresponding sub-area network input pin, and a second input from a routing path coupled to an area network input pin, that equalizes delays from a source to a plurality of locations on a target device to route one of 1) a single signal to the plurality of locations, and 2) a plurality of signals to the plurality of locations, wherein each of the plurality of signals is routed to a different one of the plurality of locations.

11. The non-transitory computer readable medium of claim 10, wherein determining the size of the low-skew network needed for routing the signal comprises determining a number of nodes the signal routes to.

12. The non-transitory computer readable medium of claim 10 further comprising programming each of the selectors to output one of 1) the first input such that the plurality of signals are output to the plurality of locations, and 2) the second input such that the single signal from the area network input pin is output to the plurality of locations.

\* \* \* \* \*